United States Patent

Altoz et al.

Patent Number: 4,674,704
Date of Patent: Jun. 23, 1987

[54] DIRECT AIR COOLING SYSTEM FOR AIRBORNE ELECTRONICS

[75] Inventors: Frank E. Altoz; John J. Buckley, both of Catonsville, Md.

[73] Assignee: The United States of America as represented by the Secretary of the Air Force, Washington, D.C.

[21] Appl. No.: 804,034

[22] Filed: Dec. 3, 1985

[51] Int. Cl.⁴ .............................................. B64C 21/02
[52] U.S. Cl. .............................. 244/1 R; 244/117 A; 62/DIG. 5; 361/383; 361/384
[58] Field of Search ............ 244/1 R, 117 A, 53 B, 244/57; 62/DIG. 5, 406, 407, 408, 410, 411, 412, 241; 98/1.5; 165/44; 361/383, 384

[56] References Cited

U.S. PATENT DOCUMENTS

| | | | |
|---|---|---|---|
| 2,319,894 | 5/1943 | Vokes | 244/1 R |
| 2,721,715 | 10/1955 | Hoadley | 244/130 |
| 2,902,597 | 9/1959 | Leidy et al. | 361/384 |
| 3,062,484 | 11/1962 | Himka | 244/53 |
| 3,104,522 | 12/1963 | Pennington et al. | 60/35.6 |
| 3,752,422 | 8/1973 | Runnels et al. | 244/53 B |
| 3,783,935 | 1/1974 | Simmons et al. | 165/44 |
| 3,977,206 | 8/1976 | Simmons | 244/117 A |
| 4,174,083 | 11/1979 | Mohn | 244/53 B |
| 4,250,703 | 2/1981 | Norris et al. | 60/39.09 P |
| 4,275,857 | 6/1981 | Bergsten | 244/53 B |
| 4,504,030 | 3/1985 | Kniat et al. | 244/117 A |

Primary Examiner—Joseph F. Peters, Jr.
Assistant Examiner—Rodney Corl
Attorney, Agent, or Firm—Jules J. Morris; Donald J. Singer

[57] ABSTRACT

A direct air cooling system 12 for electronics carried by aircraft. The cooling system provides a submerged air scoop 16 which directs outside air to several electronic modules 14. The air flows through passages 76 in the modules 14 which are adjacent to circuit boards 74, 78 bearing discrete electronic components 88. A foil layer 86 and aluminum fin stock help transfer heat from the electronic components to the directed air. Heated air is then exhausted through exhaust port 24 or 28.

7 Claims, 6 Drawing Figures

DIRECT AIR COOLING SYSTEM FOR AIRBORNE ELECTRONICS

STATEMENT OF GOVERMENT INTEREST

The invention described herein may be manufactured and used by or for the Governxent for governmental purposes without the payment of any royalty thereon.

TECHNICAL FIELD

This invention relates to cooling systems for electronic components and is particularly suited to cooling electronic modules carried in airborne pods.

BACKGROUND OF THE INVENTION

Typically electronic devices are cooled by means of passive natural radiation from an associated heat sink device, usually constructed of aluminum. High powered electronic devices, however, generate large amounts of heat and require specialized cooling systems to prevent overheating.

A simple system once commonly used to cool airborne electronics in the 1950's and 1960's was a ducted air apparatus wherein air flowing past the exterior of an aircraft was directed past the electronic devices to air cool them directly. This method of cooling has been abandoned for several reasons. One important defect with this method was that contaminants carried in the cooling air were deposited on the electronic components and circuitry. These deposits caused component damage and failure in addition to decreasing cooling efficiency. Secondly, this type of simple air duct system is incapable of adequately cooling modern electronic components since electronic components have changed radically in the last decade and have become smaller and more powerful. Small powerful components produce large amounts of heat in a smaller area and thus result in a large cooling load. Passing a sufficient quantity of cool air past such components raises difficult problems. Further, as aircraft speeds have increased and component size has decreased, directly subjecting such components to a possibly damaging airstream has become impracticable. For these reasons more complex cooling systems have been devised which cool components indirectly by conduction.

An element common to most modern airborne electronics conductive cooling systems is a cold plate which conducts heat away from electronic modules. Cold plate systems generally introduce a heat loss penalty of 30°–40° C. between the coolant and electronic devices to be cooled. This heat penalty increases the heat load on the coolant and increases the amounts of coolant required to properly cool the electronic devices. Common coolants used in evaporative cooling systems include water and freon. An example of a modern cooling system is found in U.S. Pat. No. 3,776,305 to Simmons. Simmons utilizes a mixture of different systems and coolants. Such systems tend to require a relatively high level of complexity and as a result are somewhat unreliable.

A common type of conductive cooling system utilizes freon refrigerant to cool heat transfer cold plates adjacent to the electronic devices. This relatively complex system is similar to that used in a conventional refrigerator and requires relatively long conductive paths with their associated heat losses. An energy cost is also incurred in driving the freon through the cooling system.

It is therefore an object of this invention to provide a direct air cooling system that is relatively uncomplicated yet solves the problems previously associated with direct air cooling systems.

In view of the above objective a need arises for providing large quantities of air for the direct air cooling system. Conventional external air scoops are capable of providing large quantities of ram air, however, aircraft drag and aesthetics dictate against the use of external air scoops. This is especially true in modern aircraft where pod and aircraft fuselage streamlining is carried to the extreme in order to lower aircraft drag and improve aircraft manuverability. As a result the submerged type of air scoop is greatly preferred. Unfortunately, it is well know that submerged air scoops are subject to choking and are inferior collectors of air as compared to the older external air scoops which are placed away from the aircraft fuselage or pod. An object of this invention is therefore to provide a submerged air scoop capable of providing large quantities of air to a direct air cooling system.

As stated above; previous direct air cooling systems have had major problems due to air flow contamination. A further object of this invention therefore, is to limit air flow contamination and avoid exposure of electronic devices to contaminants without compromising the cooling of the electronic components.

SUMMARY OF THE INVENTION

This invention comprises a direct air cooling system for electronic devices on aircraft.

In the preferred embodiment of the invention a submerged air scoop is used to direct air to an air duct system that is fluidly connected to a multitude of electronic modules. Cooling air is directed through air stream conduits in each electronic module, the conduits being in close proximity to discrete heat producing electronic components.

An aspect of the preferred embodiments is the use of a foil heat spreader between the electronic components and the air stream in each electronic module. The foil maximizes heat transfer between the cooling air and the electronic components and prevents the deposition of contaminants upon the electronic components. In order to further reduce the possiblity of air flow induced contamination, contaminant traps are included in the air duct system. After the ducted air cools the electronic components it is exhausted.

A further aspect of the preferred embodiment is the inclusion in the air duct system of an exhaust fan for inducing air flow through the electronic modules when the aircraft is at rest.

In the preferred embodiment of the air scoop an air control valve is used to selectively open and close the air scoop in order to control air flow and prevent contamination. The submerged air scoop also comprises a low pressure slot for removing the relatively high pressure boundary layer from the air scoop in order to aid air flow capture.

BRIEF DESCRIPTION OF THE DRAWINGS

The foregoing and other objects and advantages of the invention will be apparent from the following more particular description of the preferred embodiment of the invention, as illustrated in the accompanying drawing, in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

Figure 1:
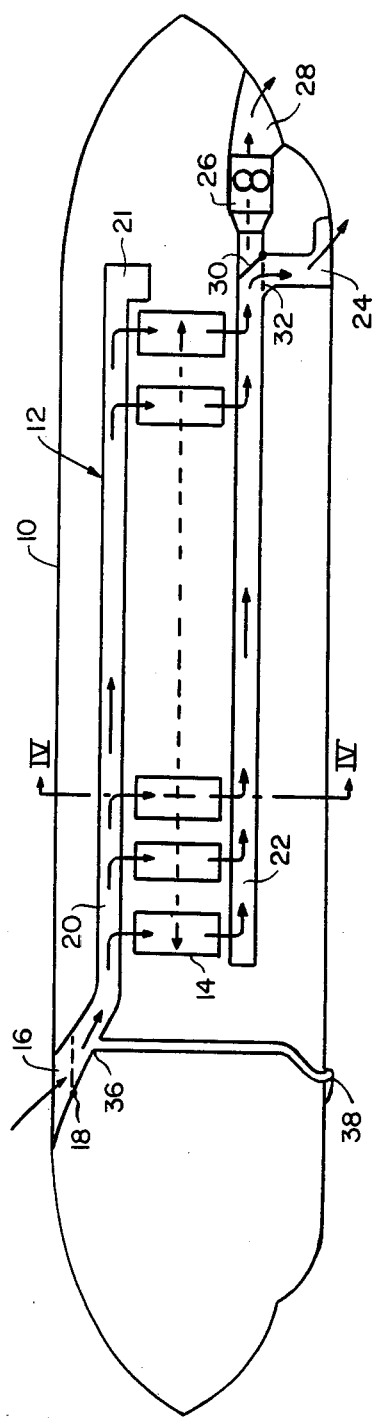
FIG. 1 is a schematic representation and air flow diagram of an electronics pod of the type carried by aircraft.

FIG. 1 is an overview and air flow diagram for a direct air cooling system 12 particularly suited for electronic modules carried aboard an aircraft or aircraft pod 10.

Aircraft pods are typically attached to an aircraft wing or fuselage and are aerodynamically streamlined to minimize their effect on aircraft performance. Such pods often carry a number of electronic modules 14 which provide radar, electronic warning or electronic masking for the associated aircraft. As discussed in the background these electronic modules frequently utilize high powered electronic components which require cooling. The direct air cooling system 12 provides a simple and reliable system for cooling a variety of high powered electronic modules.

The air flow diagram of FIG. 1 schematically shows direct air cooling of the electronic modules 14. Air enters at an inlet port 16 and travels past an inlet valve 18 to an inlet plenum 20. Any stones, gravel or isolated heavy particles inadvertantly brought into inlet plenum 20 will be caught by particle trap 21. Particle trap 21 is accessible for periodic cleaning. Coolant air is then forced through the modules 14 to exit plenum 22. From there the air travels to an exit duct 24. All the flow passages are designed to push along and exhaust any particles carried in the flow rather than allow a buildup of contaminants to occur.

Alternatively, when there is insufficient air inflow through inlet 16 an electric fan 26 can be turned on to increase air flow. When the fan is used, valve 30 is moved to the closed position 32 (shown by a dotted line) in order to direct the air to fan 26 and exit port 28. Generally, fan operation is only required when the aircraft is stationary.

Figure 2:
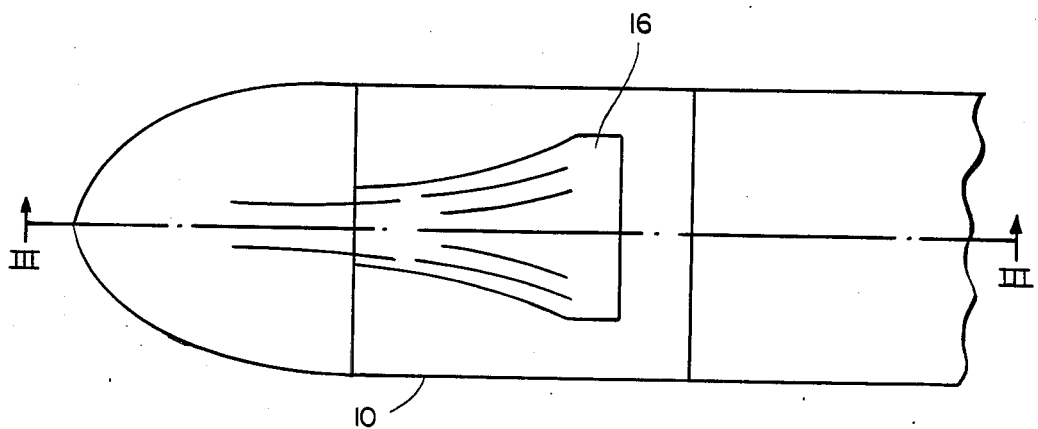
FIG. 2 is a top view of the air inlet of the electronics pod of FIG. 1.
Figure 3:
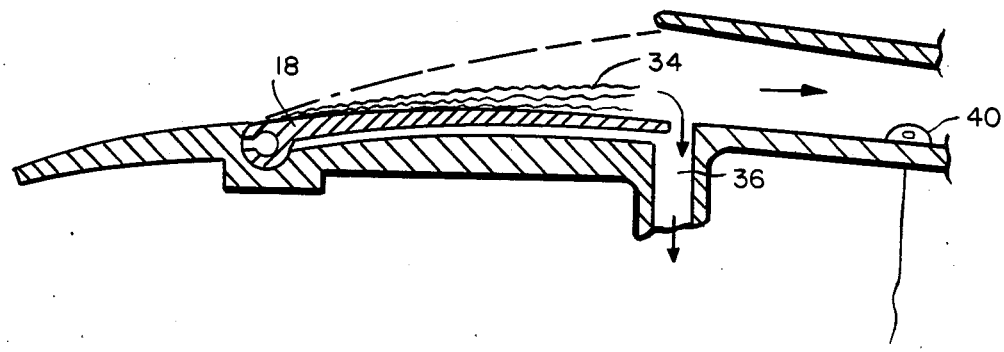
FIG. 3 is a cross-section of the air inlet of FIG. 2 taken along lines 3—3 of FIG. 2.

FIGS. 2 and FIG. 3 show the preferred configuration of the air inlet port 16. In this preferred configuration air inlet 16 is of the recessed air ramp, or submerged scoop type and does not excede the outside dixensions of pod 10. This is done in order to minimize aircraft drag. As mentioned above, drag problems and aesthetics dictate the use of submerged scoops on high speed aircraft. A common problem when using submerged scoops, however, is that a "boundary layer" 34 of slow moving air frequently forms along an internal surface of the subxerged scoop. If the boundary layer is allowed to grow it will choke the inlet airstream. This is because static air pressure is increased in the slower moving boundary layer and a positive static pressure gradient is created which causes flow separation and turbulence. The positive static pressure gradient can also aerodynamically block the inlet and cut off a large percentage of the cool air from reaching the electronic modules.

In order to avoid a blocking turbulent flow a low pressure tap 36 has been incorporated into the subxerged scoop. The low pressure tap, or slot, is located in the bottom of the scoop and draws off the boundary layer prior to flow separation. This result is an orderly inlet air flow. The inlet scoop thereby becomes a highly efficient intake for cooling air.

The pressure tap 36 can be connected to any relatively low pressure static port facing aft on the surface of the pod. An example of such a port is port 38 (FIG. 1). Submerged scoops with boundary layer control of this nature are able to provide large quantities of air and have intake efficiencies approaching those of external scoops.

Air flow through the air scoop 16 is controlled by valve 18 which selectively opens and closes. Valve 18 is primarily used to prevent debris or foreign matter from entering into the scoop and therefore into the cooling system. Debris are most often a problem during aircraft taxiing and takeoff. When ground testing is required the valve is opened to allow air to be drawn through the scoop by fan 26. Finally, when the aircraft is at very high speeds during a dash maneuver the air entering the scoop may reach unusually high temperature due to air friction over the pod or aircraft skin. When the inlet air temperature is above the preselected level, valve 18 is automatically shut to avoid over heating of the electronics. This function of the valve can, for example, be thermostatically controlled by thermostat 40 placed in the air inlet duct 20. Valve movement itself may be effected by either a conventional hydraulic actuator or an electric motor.

Figure 4:
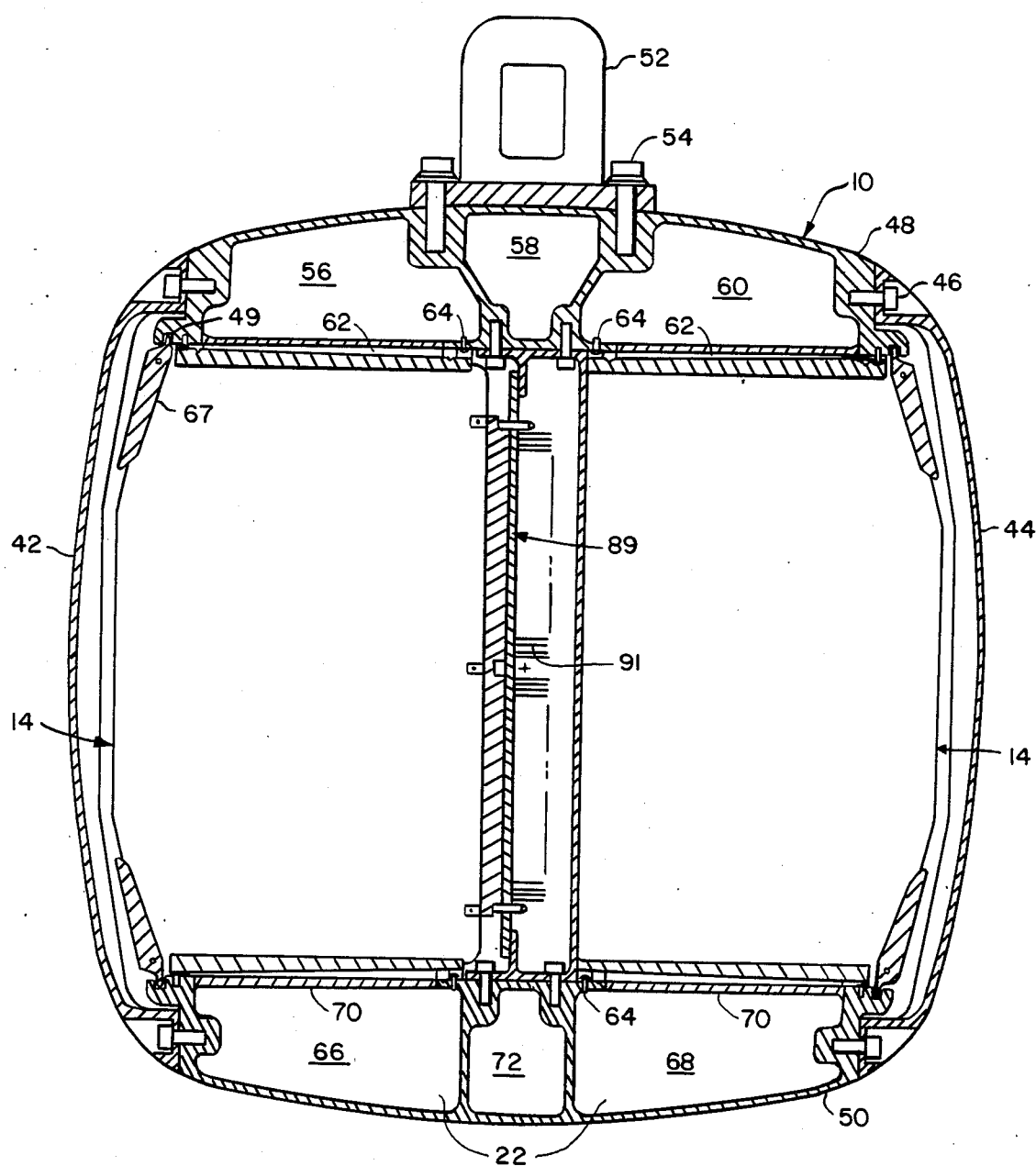
FIG. 4 is a cross-section and air flow diagram of an electronic module carried in the electronics pod of FIG. 1 and taken along lines 4—4 of FIG. 1.

FIG. 4 is a cross section of the pod 10 taken along lines 4—4 of FIG. 1. The pod 10 is constructed of four main sections, side sections 42, 44 and top and bottom sections 48, 50. The pod side sections 42 and 44 are attached by bolts 46 to the top pod section 48 and the bottom pod section 50. The electronic modules 14 lock into place inside the pod by means of circuit board release levers 67 which interlock with top pod section 48 at flange 49. Additionally, an airframe attachment ring 52 is attached by bolts 54 to the top pod section 48.

Top pod section 48 incorporates three open passages 56, 58 and 60. Passages 56 and 60 form the inlet plenum 20 that directs air from inlet scoop 16 (FIG. 1) to the various electronic modules. Although not generally required, in some situations an auxiliary liquid coolant system can be installed in auxiliary cooling passage 58.

Module mating plates 62 are bolted to the top pod portion 48 by bolts 64. Openings in plates 62 allow air to pass into module 14 cooling passages (described in more detail below with reference to FIG. 5). The air passes through the module and exits through exit plenum 22 (passages 66 and 68) in bottom pod section 50. Mating plates 70 are attached by bolts 64 and are used to direct the air from the electronic modules and to the exit plenum 22. Also note that there is an auxiliary cooling passage 72 placed in the bottom pod section.

Figure 5:
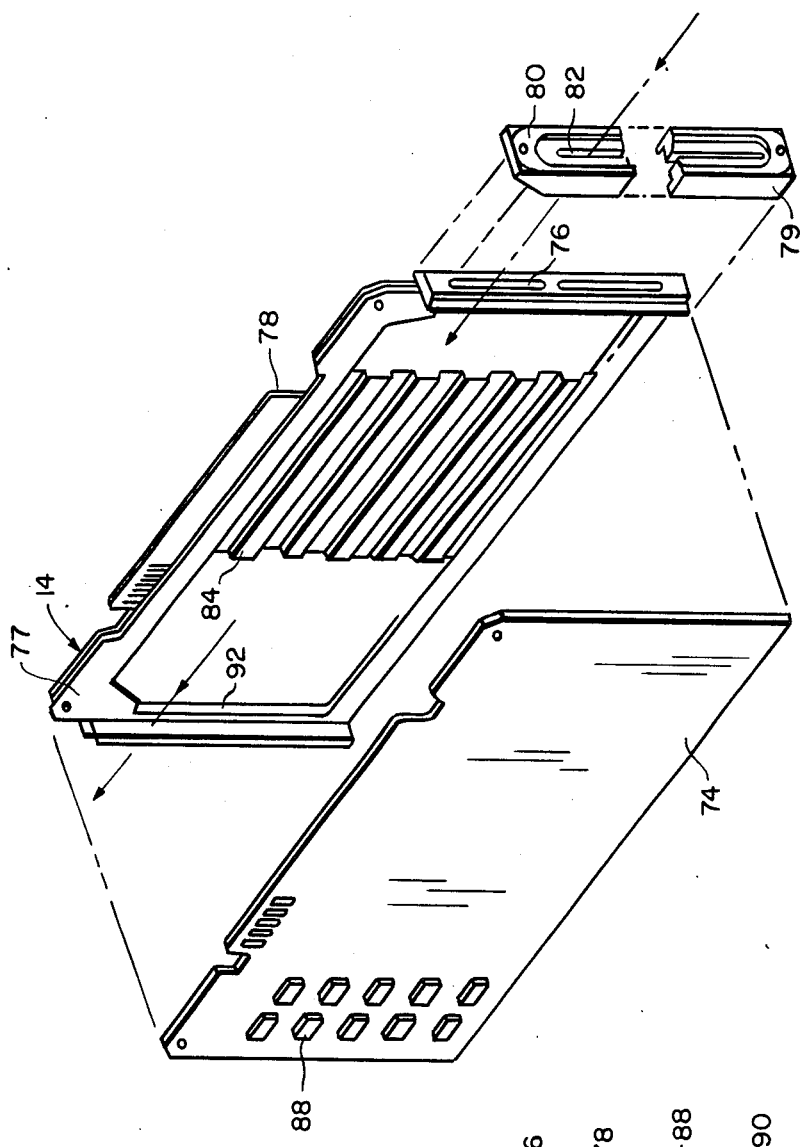
FIG. 5 is an isoxetric projection of a circuit board and air cooling passage assembly of the electronic module of FIG. 4.

The route followed by the cooling air when passing through the electronic modules can be readily understood with reference to FIG. 5. FIG. 5 is an isometric projection of an electronic module 14 including a cooling path 76 and associated circuit boards 74, 78 upon which are mounted electronic components 88. These items are also depicted in the enlarged partial cross section of FIG. 6.

The electronic module 14 consists of two back to back printed circuit boards 74, 78 bonded to an aluminum frame 77. The electronic components 88 are flat mounted to the surface of the printed circuit boards 74, 78. Communication between boards is accomplished by conventional crossover points 91 (FIG. 4) passing through connector 89 (FIG. 4).

Air from inlet plenum 20 enters the electronic module 14 past the elastomeric gasket 80 and in through air entry passage 82. The coolant air then proceeds through air passage 76 in which is located an aluminum fin stock 84 that assures uniform heat transfer throughout the passage 76. Each air passage 76 is therefore associated with two circuit boards. A typical module has several such circuit boards and half as many air passages 76. The air departs the module at an air exit 92 and flows into exit plenum 22.

Figure 6:
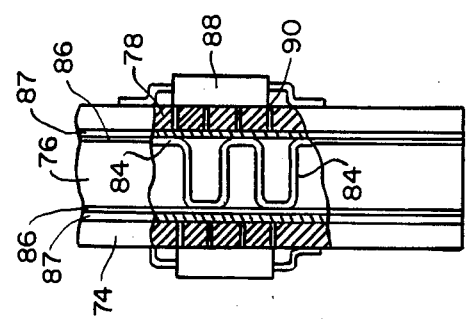
FIG. 6 is an enlarged partial cross-section of the circuit board and associated air flow passage of FIG. 5.

The heat conduction path from the electronic components to the cooling passage is most readily understood with reference to FIGS. 5 and 6. An aluminum foil layer 86 serves as a bridge between the convolutions of a thin stock 84 and provides a continuous surface from which cooling air can pick up heat from electronic components 88. This thin foil also acts as a heat spreader to spread the heat from the discrete electronic components 88 throughout the entire back of the circuit board and to the fin stock. The aluminum foil heat spreader 86 and fin stock 84 thereby maximize the heat transfer area between the heat producing elements and the cooling passage and make possible efficient use of the cooling air. A Kapton layer 87 provides electrical insulation between the circuit boards and the foil 86 while presenting a minimum thermal resistance to conduction.

Heat is carried from the electronic components 88 and through the printed circuit boards by means of plated through holes 90 under each component. The area under each component is filled with through holes for conduction whether needed or not for circuitry purposes. Electrical insulation of the electronic component 88 cases is provided by a solder mask coating and bonding agent.

An important advantage of this direct air cooling system over the air cooling systems common in the 1950's is that the cooling air does not flow directly over the sensitive electronic components 88. Instead coolant passages 76 are provided in close proximity to the electronic components. The coolant passages, however, pass the underside of the circuit boards and therefore do not subject the components to any contaminants that might be present in the cooling air.

An important element to note is that the heat transfer path between the heat producing elexents and the cooling fluid is absolutely minimized. The short conduction path maximizes heat transfer and minimizes the temperature differential between the cooling air and the electronic components to be cooled. The large number of air passages and their high heat transfer efficiency has made this direct air cooling system a very effective means of dissipating heat from electronics.

This direct air cooling system eliminates the conventional cold plate and thereby lowers the gradient between the coolant and the devices to be cooled. The direction cooling system has a conduction loss of 15°-25° C. as compared with 30°-40° C. for conventional electronic cooling systems.

Tests conducted between conventional cold plate cooling systems and the direct air cooling system have shown a marked improvement in effective cooling. Tests of a conventional freon cooling system with a 10 watt heat load resulted in a component temperature of 88° C. Tests of the direct air cooling system with a 20 watt heat load and an 18 lb. per minute air flow resulted in a component temperature of about 57° C. In both tests the circuit board components and modules were as similar as possible. It was noted experixentally that 18 lb. per minute air flow was nearly optimal air flow for the model direct air cooling system. Doubling the air flow to 36 lbs. per minute only resulted in a 4° C. drop in component temperature. Further, raisin9 the component heat load to 80 watts, elevated component temperature only about 2° C., this shows that very large amounts of heat can be removed by the direct air cooling system.

This device successfully eliminates the long conduction path typically associated with electronic modules and their cooling in aircraft pods. Further, since the direct air cooling system is exceedingly straightforward it is believed that the overall cooling system reliability will be greatly improved over previous systems and as a result electronic components will be subject to less thermal stress. Reductions in thermal stress and average component temperature, increases electronic component life and reliability.

While the invention has been particularly described with reference to a preferred embodiment thereof it will be understood by those skilled in the art that various changes in substance and form may be made therein without departing from the spirit and scope of the invention as described in the attached claims.

We claim:

1. A direct air cooling system for aircraft electronics which comprises:
    (a) a submerged air scoop for bringing an air flow from the exterior of an aircraft to its interior wherein said air scoop comprises a vacuum slot for drawing off boundary layer air from the air flow passing through said air scoop in order to avoid air flow separation and stagnation,
    (b) an inlet air duct for directing said air flow to electronic modules requiring cooling wherein said electronic modules comprise a multitude of electronic circuit board assemblies comprising circuit boards, discrete heat producing electronic components, a heat spreader and air passages adjacent to said circuit boards wherein said air passages are connected to said air inlet duct and comprise thereмally conductive fin stock positioned to produce a high capacity heat transfer area where air from said inlet duct is used to cool said circuit boards and discrete heat producing components via said heat spreader; and
    (c) an air exit port duct connected to said air passages for exhausting air to an exhaust port on the exterior of said aircraft.

2. The direct air cooling system of claim 1 wherein said air scoop further comprises a valve for controlling air flow through said scoop.

3. The direct air cooling system of claim 1 further comprising a fan for supplying air flow when said aircraft is at rest.

4. The direct air cooling system of claim 1 wherein said inlet duct further comprising a debris trap for removing contaminants from said air flow.

5. A direct air cooling system for electronics carried aboard an aircraft comprising:
   (a) a submerged air inlet exposed to air flowing past said aircraft;
   (b) a relatively low pressure slot in said submerged air inlet for removing high pressure boundary layer air from said inlet;
   (c) an air control valve for selectively controlling air flow through said submerged air inlet;
   (d) an air duct system fluidly connected to said subxerged air inlet comprising:
      (i) contaminant traps to remove contaminants from air flowing through said air duct system, and
      (ii) a fan for inducing air flow when air is not flowing past said aircraft;
   (e) an electronic module fluidly connected to said air duct system wherein cooling air from said air duct system flow directly through air passages in said electronic module adjacent to circuit boards, said circuit boards being in close proximity to discrete heat producing electronic components; and
   (f) an air exit for exhausting air heated by said electronic components.

6. The direct air cooling system of claim 5 wherein said air passages further comprise thermally conductive fin stock positioned to increase the heat transfer area between the cooling air and the circuit boards.

7. The direct air cooling system of claim 5 wherein said electronic modules further comprise a foil heat spreader interspaced between said circuit board and said air passages in order to spread the heat produced by the heat producing electronic components and to facilitate heat transfer between said circuit boards and said air flow.

* * * * *